(12) United States Patent
Tee et al.

(10) Patent No.: US 10,529,866 B2
(45) Date of Patent: Jan. 7, 2020

(54) SEMICONDUCTOR DEVICE

(75) Inventors: Elizabeth Kho Ching Tee, Sarawak (MY); Alexander Dietrich Holke, Sarawak (MY); Steven John Pilkington, Sarawak (MY); Deb Kumar Pal, Sarawak (MY)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 13/483,569

(22) Filed: May 30, 2012

(65) Prior Publication Data

US 2013/0320485 A1 Dec. 5, 2013

(51) Int. Cl.
*H01L 29/06* (2006.01)
*H01L 29/861* (2006.01)

(52) U.S. Cl.
CPC .................. *H01L 29/861* (2013.01)

(58) Field of Classification Search
CPC ............ H01L 29/861; H01L 27/76283; H01L 27/1203; H01L 29/7317; H01L 29/7322; H01L 29/7824
USPC ................ 257/506, 507, 508, 510, 347, 353
See application file for complete search history.

(56) References Cited

U.S. PATENT DOCUMENTS

| | | | |
|---|---|---|---|
| 4,902,637 A * | 2/1990 | Kondou et al. | 438/152 |
| 5,113,236 A * | 5/1992 | Arnold et al. | 257/347 |
| 5,362,979 A * | 11/1994 | Merchant | 257/340 |
| 5,489,790 A * | 2/1996 | Lage | 257/330 |
| 5,525,824 A * | 6/1996 | Himi et al. | 257/370 |
| 5,565,697 A * | 10/1996 | Asakawa et al. | 257/347 |
| 5,731,603 A | 3/1998 | Nakagawa et al. | |
| 5,825,067 A * | 10/1998 | Takeuchi et al. | 257/355 |
| 6,064,086 A | 5/2000 | Nakagawa et al. | |
| 6,118,152 A * | 9/2000 | Yamaguchi et al. | 257/347 |
| 6,121,659 A * | 9/2000 | Christensen et al. | 257/347 |
| 6,130,458 A * | 10/2000 | Takagi et al. | 257/351 |
| 6,150,697 A * | 11/2000 | Teshigahara | H01L 21/76264 257/335 |
| 6,191,456 B1 | 2/2001 | Stoisiek et al. | |

(Continued)

FOREIGN PATENT DOCUMENTS

WO    2010/128361    11/2010

OTHER PUBLICATIONS

Garner, D.M. et al., "The integration of high-side and low-side LIGBTs on partial silicon-on-insulator," *Solid-State Electronics*, 44, pp. 929-935 (2000).

(Continued)

*Primary Examiner* — Ori Nadav
(74) *Attorney, Agent, or Firm* — Thompson Hine LLP

(57) ABSTRACT

An SOI or PSOI device including a device structure having a plurality of doped semiconductor regions. One or more of the doped semiconductor regions is in electrical communication with one or more electrical terminals. The device further includes an insulator layer located between a bottom surface of the device structure and a handle wafer. The device has an insulator trench structure located between a side surface of the device structure and a lateral semiconductor region located laterally with respect to the device structure. The insulator layer and the insulator trench structure are configured to insulate the device structure from the handle wafer and the lateral semiconductor region, and the insulator trench structure includes a plurality of insulator trenches.

24 Claims, 11 Drawing Sheets

(56) References Cited

U.S. PATENT DOCUMENTS

| | | | |
|---|---|---|---|
| 6,303,413 B1 | 10/2001 | Kalnitsky et al. | |
| 6,642,599 B1* | 11/2003 | Watabe et al. | 257/509 |
| 6,670,716 B2* | 12/2003 | Christensen et al. | 257/762 |
| 6,677,622 B2 | 1/2004 | Suzuki et al. | |
| 6,727,553 B2* | 4/2004 | Kotani | 257/351 |
| 6,830,986 B2* | 12/2004 | Yamashita et al. | 438/402 |
| 7,262,109 B2* | 8/2007 | Lin et al. | 438/405 |
| 7,465,964 B2 | 12/2008 | Udrea | |
| 7,679,130 B2 | 3/2010 | Tilke et al. | |
| 7,902,608 B2 | 3/2011 | Anderson et al. | |
| 7,948,058 B2 | 5/2011 | Hara et al. | |
| 8,053,858 B2 | 11/2011 | Cai | |
| 8,134,207 B2* | 3/2012 | Watanabe | H01L 27/1203 257/343 |
| 2008/0122025 A1* | 5/2008 | Roggenbauer et al. | 257/501 |
| 2008/0266922 A1* | 10/2008 | Mumtaz | H01L 21/84 363/131 |
| 2010/0155895 A1* | 6/2010 | Tsai | H01L 29/7393 257/578 |

OTHER PUBLICATIONS

Hoelke, A. et al., "A 200V Partial SOI 0.18 μm CMOS Technology," presented at the International Symposium on Power Semiconductor Devices, 2 pages (2010).

Sakano, J. et al., "Large Current Capability 270V Lateral IGBT with Multi-Emitter," *Proceedings of The 22nd International Symposium on Power Semiconductor Devices & ICs*, Hiroshima, pp. 83-86 (2010).

Udrea, F. et al., "Breakdown analysis in JI, SOI and partial SOI power structures," *Proceedings 1997 IEEE International SOI Conference*, pp. 102-103.

* cited by examiner

SEMICONDUCTOR DEVICE

TECHNICAL FIELD

The invention relates to the field of silicon-on-insulator (SOI) semiconductor devices. More specifically, the invention relates to, but is not restricted to, lateral high voltage structures formed with SOI power integrated circuit technologies.

BACKGROUND

SOI technology may be used for power integrated circuits, as it provides effective isolation of devices and low leakage currents within devices. SOI technology provides the isolation of the structures from the substrate by the introduction of an insulator layer, typically formed from a buried silicon oxide (BOX). In addition, isolation of the device structures of a device from nearby devices may be provided by deep trench isolation (DTI).

Conventional SOI power devices may suffer from a low breakdown voltage because electrostatic potential distribution cannot be spread into a substrate due to the existence of a buried oxide layer.

To overcome these problems, partial SOI (PSOI) technology may be used. PSOI devices make use of both a BOX layer and depletion of the handle wafer to support the breakdown voltage of the device. PSOI technology typically allows better off-state characteristics than those seen with SOI technology, and may also offer advantages such as higher switching speeds, as the BOX layer may be thinner, lower drain to handle wafer capacitance and aiding dissipation of heat generated in the device.

PSOI devices are typically manufactured to have an aperture in the BOX layer at a drain or anode end of the device. PSOI devices may also comprise oppositely doped semiconductor regions to form a buried diode isolated physically from the device structure.

SUMMARY

According to the invention in a first aspect, there is provided an SOI or PSOI device, comprising: a device structure comprising a plurality of doped semiconductor regions, one or more of the doped semiconductor regions being in electrical communication with one or more electrical terminals; an insulator layer located between a bottom surface of the device structure and a handle wafer; and an insulator trench structure located between a side surface of the device structure and a lateral semiconductor region located laterally with respect to the device structure, wherein the insulator layer and the insulator trench structure are configured to insulate the device structure from the handle wafer and the lateral semiconductor region, and wherein the insulator trench structure comprises a plurality of insulator trenches.

Optionally, the insulator trench structure comprises inner and outer insulator trenches separated by a semiconductor island.

Optionally, the number of insulator trenches is configured to prevent the formation of an inversion layer in an outer doped semiconductor region of the device structure at the boundary between the outer doped semiconductor region and an innermost insulator trench when a potential difference exists between the lateral semiconductor region and the outer doped semiconductor region.

Optionally, the potential difference is in the range from 100 Volts to 200 Volts.

Optionally, the width of the semiconductor island is equal to or greater than a minimum width specified by a design rule.

Optionally, the width of the semiconductor island is a multiple of a width specified by a design rule.

Optionally, the width of the semiconductor island is 0.5 μm or greater.

Optionally, the device further comprises: a dielectric layer on an upper surface of the device, wherein at least one of the electrical terminals is in electrical communication with a doped semiconductor region adjacent to the inner trench, and comprises a field plate extending over at least part of the dielectric layer and the semiconductor island.

Optionally, the field plate is configured to bias the semiconductor island and the doped semiconductor region to substantially the same voltage when a voltage is applied to the field plate.

Optionally, the device further comprises a lateral semiconductor region terminal in electrical communication with the lateral semiconductor region, and wherein a distance between the lateral semiconductor region terminal and the field plate is sufficient to prevent breakdown of the dielectric layer between the lateral semiconductor region terminal and the field plate when a voltage difference of 100 Volts or greater is applied between the lateral semiconductor region terminal and the field plate.

Optionally, the distance between the lateral semiconductor region terminal and the field plate is designed to be 0.23 μm.

Optionally, the insulator trench structure extends around at least one further side of the device structure, and wherein at least part of the field plate extends along the at least one further side of the device structure over at least part of the semiconductor island.

Optionally, the at least part of the field plate extends to cover all of the semiconductor island opposite an outer doped semiconductor region.

Optionally, the insulator layer comprises an aperture through which the lateral semiconductor region and the handle wafer are connected.

Optionally, the handle wafer and the lateral semiconductor region are oppositely doped to form a buried diode structure.

Optionally, the insulator trench structure surrounds the device structure on all sides.

Optionally, the insulator layer comprises buried silicon oxide.

Optionally, the insulator trenches each comprise a trench filled with a silicon oxide.

Optionally, the device is a high voltage device.

According to the invention in a second aspect, there is provided an SOI or PSOI device, comprising: a device structure comprising a plurality of doped semiconductor regions arranged to be in electrical communication with one or more electrical terminals; an insulator layer located between a bottom surface of the device structure and a handle wafer; and an insulator trench structure located between a side surface of the device structure and a lateral semiconductor region located laterally with respect to the device structure, wherein the insulator layer and the insulator trench structure are configured to insulate the device structure from the handle wafer and the lateral semiconductor region, and wherein the width of the insulator trench structure is configured to prevent the formation of an inversion layer in the device structure at the boundary between the device structure and the insulator trench structure when a voltage difference of 100 Volts or greater is applied between the lateral semiconductor region and the device structure.

According to the invention in a third aspect, there is provided an SOI or PSOI device comprising: a device structure comprising a plurality of doped semiconductor regions; and an insulator trench structure located between a side surface of the device structure and a lateral semiconductor region located laterally with respect to the device structure, wherein the insulator trench structure comprises first and second insulator trenches and wherein the first insulator trench is located between the side surface of the device structure and the second insulator trench.

According to the invention in a fourth aspect, there is provided a semiconductor wafer comprising a plurality of devices as described above.

BRIEF DESCRIPTION OF THE FIGURES

Exemplary embodiments of the invention will now be described with reference to the accompanying drawings, in which.

DETAILED DESCRIPTION

The inventors have appreciated that a leakage current path may exist in some high voltage (HV) SOI devices when they are in the off-state due to the large potential differences that may be seen across the insulator layers of the device. This is explained in greater detail below with reference to a number of SOI devices shown in FIGS. 1 to 8.

Generally, SOI and PSOI devices comprise a BOX layer and an insulator trench. The inventors have appreciated that the doped semiconductor regions of the device structures may therefore be subject to a coupling effect from a semiconductor handle wafer located beneath the BOX layer and/or a lateral semiconductor region located laterally adjacent to the insulator trench. In general, when the handle wafer and/or the lateral semiconductor region is biased to a voltage different to that of the doped semiconductor regions, the doped semiconductor region may be depleted, accumulated or even inverted in a region close to the boundary between the BOX layer and the doped semiconductor region and/or close to the boundary between the insulator trench and the doped semiconductor region. Whether the doped semiconductor region is accumulated, depleted or inverted is dependent on whether it is n-doped or p-doped, the bias applied to the handle wafer or lateral semiconductor region and the thickness of the BOX layer.

This phenomenon may become catastrophic in many HV or power devices as generally they are lowly doped to sustain a high blocking voltage. Such devices are typically lowly doped as too high a doping may result in the junction electric field of the device being more abrupt and the device may therefore reach the critical electric field earlier, which leads to earlier breakdown voltage. Additionally, the larger potential difference between the device structure of an HV device and the surrounding lateral semiconductor regions and the handle wafer, either in low side or high side applications, also increases the possibility of earlier breakdown. In a low side application, a voltage of the body (or well) of the device is held at ground. In a high side application, the body (or well) bias is held at a high voltage, e.g. the operating voltage of the device.

This phenomenon is less likely to take place if the silicon substrate is thin and highly doped. If the silicon on top of the buried oxide layer is thin, it is easier to obtain high doping as doping is no longer limited by the need for high energy implantation. The higher the doping of the silicon, the more difficult it is for depletion to happen due to coupling effect from the handle wafer.

Figure 1:
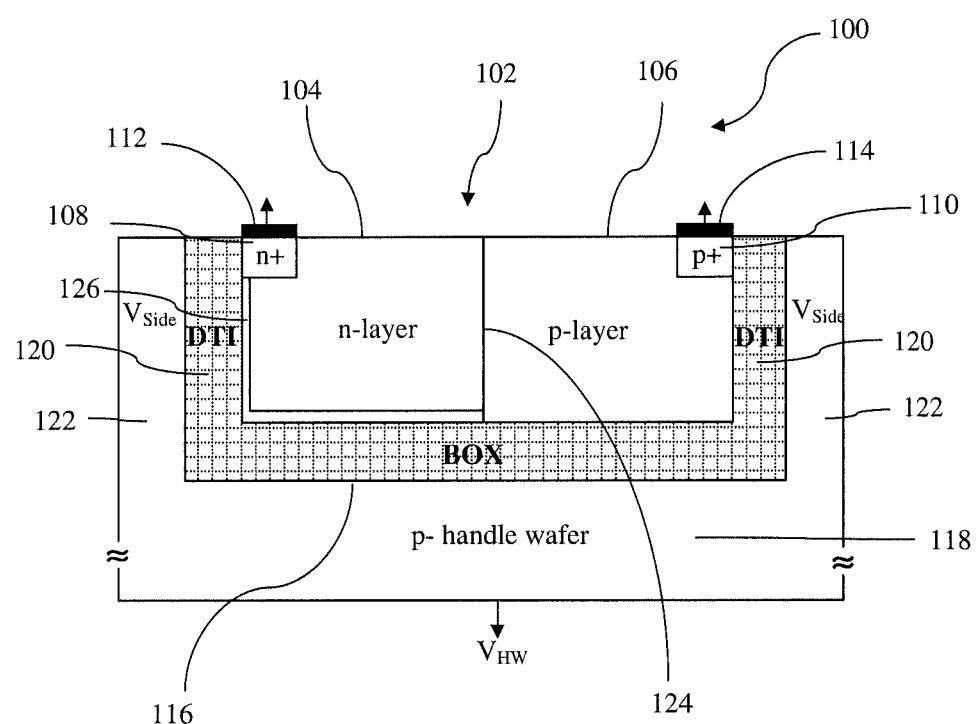
FIG. 1 is a schematic diagram of a cross section through an exemplary diode on an SOI wafer.

FIG. 1 shows a conventional high voltage diode 100 located on an SOI wafer. The diode comprises a device structure 102 comprising an n-doped semiconductor region 104 and a p-doped semiconductor region 106. The doped semiconductor regions provide the p-n junction of the diode 100. A further n-doped semiconductor region 108 is more heavily doped with respect to, and is located within, the n-doped semiconductor region 104. A further p-doped region 110 is more heavily doped with respect to, and located within, the p-doped semiconductor region 106. The further doped regions 108, 110 may be considered to be "highly doped". The term "highly doped" is a well known term of art and would be easily understood by the skilled person to encompass semiconductor materials with levels of dopant atoms in the range from 1e17/cm$^3$ to 1e19/cm$^3$. Specifically, the amount of dopant in regions 108, 110 may be approximately 1e18/cm$^3$. For other high voltage devices, the well dopant concentration may be approximately 1e17/cm$^3$, and the drift dopant concentration may be approximately 1e15/cm$^3$ to 1e16 cm$^3$.

The further n-doped region 108 and the further p-doped region 110 are in electrical communication with electrical terminals 112 and 114 respectively. A BOX layer 116 is located beneath the device structure 102 and is arranged to electrically insulate the device structure 102 from a p-doped handle wafer 118. An insulator trench 120 is located between a side surface of the device structure 102 and a lateral semiconductor region 122. In the exemplary device 100 of FIG. 1, the isolator trench 120 is a deep trench isolation (DTI) trench that surrounds the device structure 102.

It is noted that the term "high voltage" is a term well known in the art and, as used herein, encompasses power semiconductor devices designed to handle high voltage power supplies. The term high voltage when applied to devices may, for example, encompass devices configured for use with voltages of 12 Volts or greater. More specifically, voltages in the range from 12 Volts to 500 Volts, from 100 Volts to 300 Volts, and still more specifically, voltages in the range from 100 Volts to 200 Volts. In addition, the term "power device" as used herein encompasses devices configured to operate within power circuits to provide power supplies in the high voltage ranges disclosed above.

While the diode 100 is in an off-state and used in a low-side application, the p-n junction 124 formed between the n-doped semiconductor region 104 and the p-doped semiconductor region 106 is reverse biased. If a voltage $V_{cathode}$ is applied to the terminal 112 and the handle wafer 118 is grounded, a potential difference will exist across the BOX layer 116 between the n-doped region 104 and the handle wafer 118. If the potential difference is large enough, a region of the n-doped region 104 close to the interface with the BOX layer 116 will be inverted. That is, the concentration of minority "p" carriers will exceed the concentration of majority "n" carriers at a region of the n-doped semiconductor region 104 close to the interface with the BOX layer 116. The lateral semiconductor region 122 adjacent to the DTI 120 will have the potential $V_{Side}$ that is dependent on the voltage $V_{HW}$ and the devices located beside the diode 100. If the potential difference between $V_{Side}$ and $V_{cathode}$ is high enough, a region close to the boundary between the n-doped region 104 and the DTI 120 will also be inverted. An inverted region 126 formed by minority p-carriers may therefore exist at a region of the n-doped region 104 close to, and running alongside, the boundary between the n-doped region 104 and the DTI 120 and the n-doped region 104 and the BOX insulator layer 116. Under correct conditions, the inverted region 126 may form part of a current path.

However, the inventors have appreciated that for a leakage current path to exist within the device, there must be an inverted region in which p-carriers may be transferred between two p-doped regions, or an inverted region in which n-carriers may be transferred between two n-doped regions. In the diode 100, the inverted region 126 comprises p-carriers but is between the p-doped region 106 and the further n-doped region 108. Therefore, there is no current leakage path when the diode is in the off-state.

In a high-side application, $V_{HW}$ is tied to high voltage, for example in the range from 100 Volts to 200 Volts. This may result in a significant potential difference across the BOX layer 116 and the DTI 120 between the p-doped region 106 and the handle wafer 118 and between the p-doped region 106 and the lateral semiconductor region 122 in a similar way to that explained above. As a result, a region of the p-doped semiconductor region 106 close to the BOX insulator layer 116 and the DTI 120 will be inverted. However, as with the low side application, no current leakage path exists as the current path comprises n-carriers and is between the n-doped region 104 and the further p-doped region 110. Thus, a current leakage path is not seen in the diode 100 of FIG. 1 in either the high-side or low-side applications.

Figure 2:
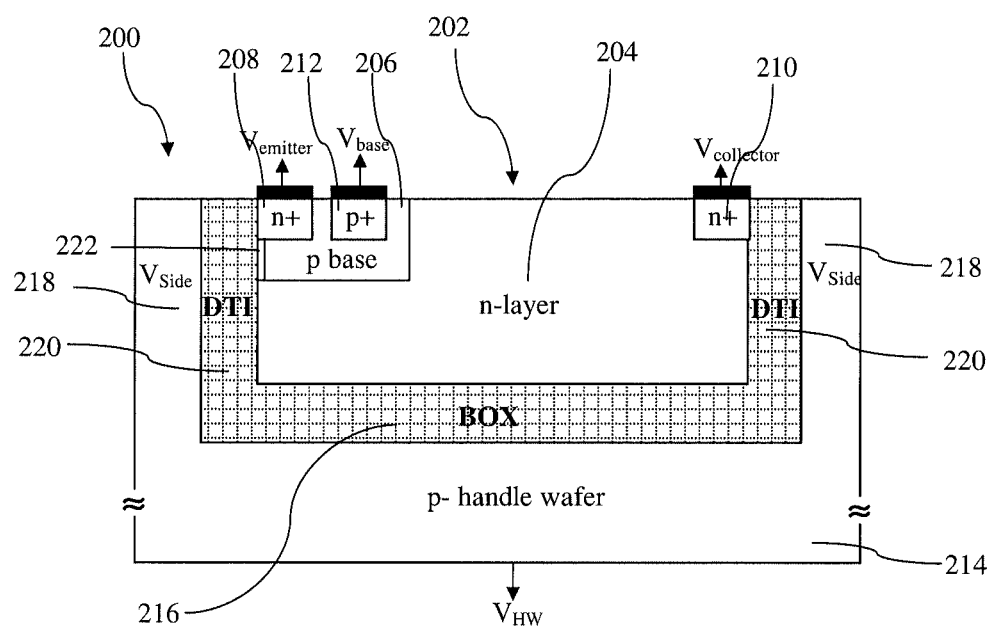
FIG. 2 is a schematic diagram of a cross section through an n-p-n high voltage bipolar transistor on an SOI wafer.

FIG. 2 shows a conventional HV bipolar transistor 200 comprising a device structure 202. The device structure 202 comprises an n-p-n junction made up of an n-doped p-layer region 204, a p-doped base region 206 and highly n-doped emitter 208, highly n-doped collector 210 and highly p-doped base 212 regions. As with the diode 100 of FIG. 1, the device structure of the transistor 200 is insulated from a handle wafer 214 by a BOX insulator layer 216, and insulated from lateral semiconductor regions 218 by DTI insulator trench 220.

In a high-side application when the transistor is in an off state, the collector terminal will be held at a high voltage, for example around 100 Volts or greater, the base terminal will be at a low voltage, for example zero Volts or less, the emitter terminal will be held at a low voltage, for example zero Volts or less, and the handle wafer voltage, $V_{HW}$, will be held at a high voltage, for example around 100 Volts or greater. In this arrangement, if the voltage $V_{Side}$ is sufficiently high, a region 222 of the p-base region 206 that is close to the boundary between the p-base region 206 and the DTI insulator trench 220 may be inverted due to the coupling effect discussed above with reference to FIG. 1.

The inverted region 222 may provide a current leakage path as electrons can flow from n-doped emitter region 208 emitter, along the inverted region 222 of the p-base region 206, across the n-layer region 204 to the n-doped collector region 210. This leads to leakage current during the off-state.

In a low-side application, $V_{HW}$ is grounded and $V_{side}$ would therefore be low. In this arrangement, the coupling effect may cause a region of the n-base region 204 to be inverted close to the boundary between the n-base region 204 and the BOX layer 216, and close to the boundary between the n-base region 204 and the DTI insulator trench 220. However, as with the diode 100 of FIG. 1, there is no complete leakage path due to highly n-doped collector region 210. Therefore, the HV bipolar transistor 200 may not be susceptible to the leakage current path in a low-side application, but is susceptible in a high-side application.

Figure 3:
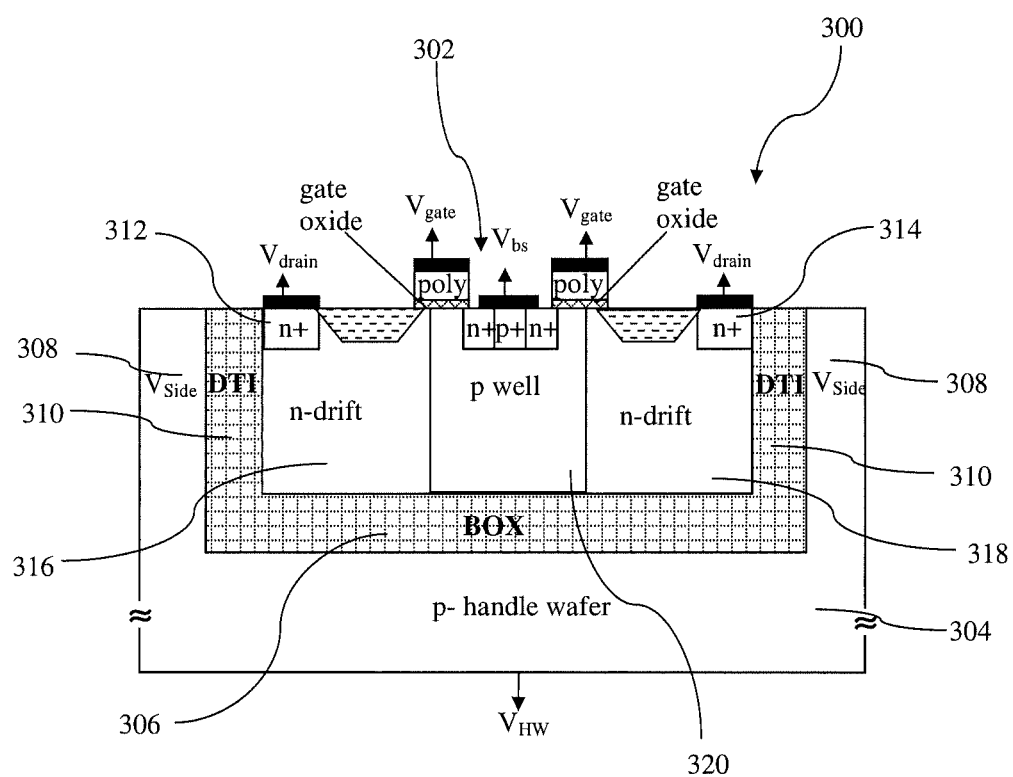
FIG. 3 is a schematic diagram of a cross section through an n-type asymmetrical high voltage laterally diffused metal oxide semiconductor (LDMOS) device on an SOI wafer.

FIG. 3 shows a conventional asymmetric HV LDMOS device 300. The device 300 comprises a drain-source-drain arrangement. As with the devices 100, 200 of FIGS. 1 and 2, a device structure 302 is insulated from a handle wafer 304 by a BOX insulator layer 306, and is insulated from a lateral semiconductor region 308 by a DTI insulator trench 310.

Typically, in an off state, n-doped drain regions 312, 314 of the device 300 will be at a high voltage, for example 100 Volts or greater, and the gates and the source will be at a low voltage, for example zero Volts or less. Therefore, in a low-side application, the voltage at the handle wafer 304, $V_{HW}$, will be low, for example zero Volts or less, and a large potential difference may be seen across the BOX insulator layer 306 between n-doped n-drift regions 316, 318 and the handle wafer 304, and across the DTI insulator trench 310 between the n-drift regions 316, 318 and the lateral semiconductor region 308. A region of the n-drift regions 316, 318 close to the boundary with the BOX insulator layer 306 and the DTI insulator trench 310 may therefore be inverted. However, a complete leakage current path does not exist because the inverted regions will provide a path between the n-drift drain regions 312, 314 and a p-doped p-well region 320.

In a high-side application, the p-well region 320 may be subject to inversion close to the boundary with the BOX insulator layer 304. There is therefore a complete current path between the n-doped drain regions 312, 314. However, the n-doped drain regions 312, 314 typically always have the same potential, in which case no leakage current will flow between the two. If the n-doped drain regions 312, 314 are held at different voltages, a leakage current may exist.

Figure 4:
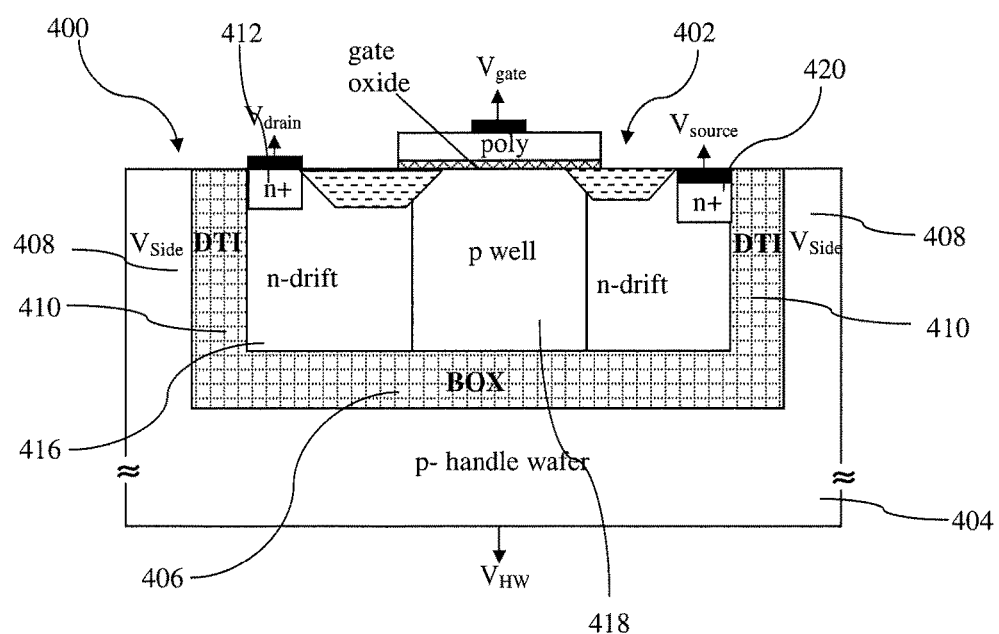
FIG. 4 is a schematic diagram of a cross section through an n-type symmetrical high voltage LDMOS on an SOI wafer.

FIG. 4 shows a conventional symmetrical HV LDMOS 400. The construction of the device 400 is similar to the construction of the devices discussed above in that a device structure 402 is insulated from a handle wafer 404 by a BOX insulator layer 406, and is insulated from a lateral semiconductor region 408 by a DTI insulator trench 410.

Typically, in an off state, an n-doped drain region 412 of the device 400 will be at a high voltage, for example 100 Volts or greater, and the gate and source will be at a low voltage, for example zero Volts or less. Therefore, in a low-side application, when the voltage at the handle wafer 404, $V_{HW}$, will be low, for example zero Volts or less, a large potential difference may be seen across the BOX insulator layer 406 with an n-doped n-drift region 416 and the handle wafer 404, and across the DTI insulator trench 410 between the n-drift region 416 and the lateral semiconductor region 408. The coupling effect between these semiconductor regions may result in inversion of a region of the n-drift region 416 close to the boundary with the DTI insulator trench 410 and the BOX insulator layer 406. However, no complete leakage current path may exist because the inverted region connects the n-doped drain region 412 and a p-doped p-well region 418.

In a high-side application the voltage $V_{HW}$ is high and so a potential difference can be seen across the BOX insulator layer 406 between the p-well region 418 and the handle wafer 404, which may cause a region of the p-well region 418 close to the boundary with the BOX insulator layer 406 to become inverted. In this case, a complete current leakage path exists between the n-doped drain region 412, which is at a high voltage, and an n-doped source region 420, which is at a low voltage relative to the drain region 412.

Figure 5:
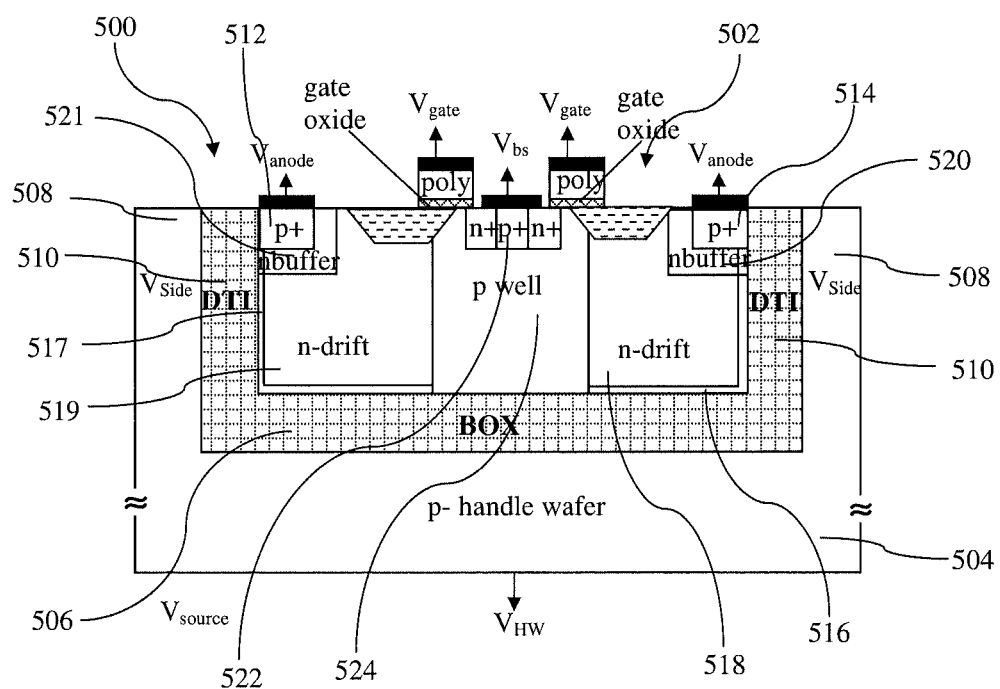
FIG. 5 is a schematic diagram of a cross section through an n-type lateral insulated-gate bipolar transistor (LIGBT) on an SOI wafer.

FIG. 5 shows a conventional LIGBT device 500. As with the devices discussed above, the LIGBT comprises a device structure 502 insulated from a handle wafer 504 by a BOX insulator layer 506, and is insulated from a lateral semiconductor region 508 by a DTI insulator trench 510. The device structure 502 is much more complex than those discussed above due to its inherent n-p-n-p thyristor structure.

Typically, in an off state, p-doped anode regions 512, 514 of the device 500 will be at a high voltage, for example 100 Volts or greater, and the gate and source regions will be at a low voltage, for example zero Volts or less.

Therefore, during low-side application when both the $V_{HW}$, and therefore also $V_{Side}$, is low, a region 516 of an n-doped n-drift region 518 and an n-doped n-buffer region 520 close to the boundary with the BOX insulator layer 506 and/or the DTI insulator trench 510 may be inverted. Additionally, a region 517 of another n-doped n-drift region 519 and another n-doped n-buffer region 521 close to the boundary with the BOX insulator layer 506 and/or the DTI insulator trench 510 may also be inverted. This provides two current leakage paths: a first current path from the p-doped anode 514, through the inverted region 516 of the n-drift region 518 and the n-buffer region 520 to a highly p-doped pick up 522 in the p-well region 524; and a second current path from the p-doped anode 512, through the inverted region 517 of the n-drift region 519 and the n-buffer region 521 to the highly p-doped pick up 522 in the p-well region 524.

In a low-side application, a potential difference may be seen across the BOX insulator layer 506 between the p-well 524 and the handle wafer 504. A region of the p-well 524 close to the boundary with the BOX insulator layer may therefore be inverted. However, no complete current leakage path will typically exist, as the two anode regions 512, 514 are p-doped.

The inventors have further appreciated that the problem highlighted above becomes more complex in PSOI technology. The buried diode often included in a PSOI device is typically fixed at high reverse bias voltage to deplete the semiconductor of the handle wafer. This helps to redistribute the electrostatic potential line which in a standard SOI device is constrained within the drift regions of the device structure and the BOX insulator layer. The arrangement of the PSOI device therefore allows higher breakdown voltage. The use of PSOI devices makes the leakage current path problem described above more complicated as the lateral semiconductor region and the handle wafer are oppositely doped to produce the buried diode. Therefore, $V_{Side}$ and $V_{HW}$ will have varied voltage along the depth of silicon as, when the buried diode is reverse biased, the potential is spread. For example, if a 200 Volt reverse bias is applied to the buried diode, the potential will drop from 200 Volts to 0 Volts across the substrate. In SOI devices, there is typically only one voltage, 0 Volts, in both low side and high side applications. In a high side operation, the body (or well) of a device is at the operating voltage, but the handle wafer (or the SOI substrate) is grounded. In the SOI devices discussed above, $V_{Side}$ and $V_{HW}$ only have negligible potential difference due to the handle wafer resistance.

Figure 6:
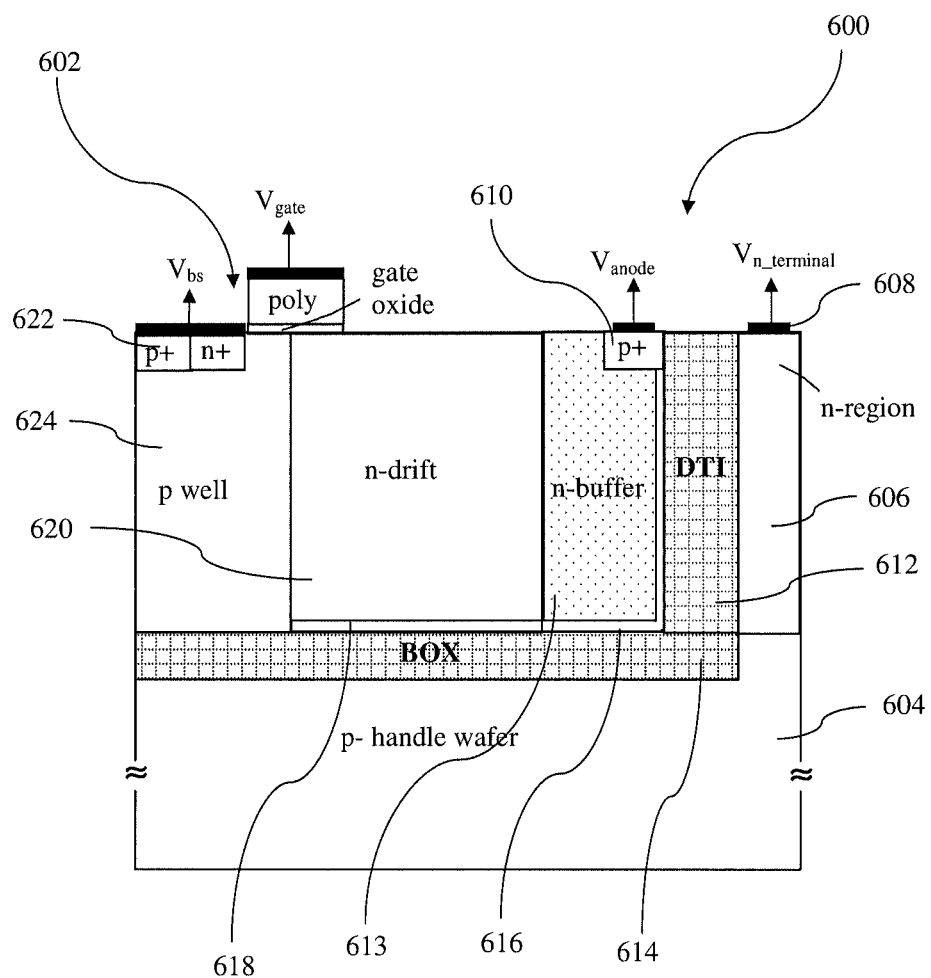
FIG. 6 is a schematic diagram of a partial cross section through an n-type LIGBT on an SOI wafer comprising PSOI technology.
Figure 7:
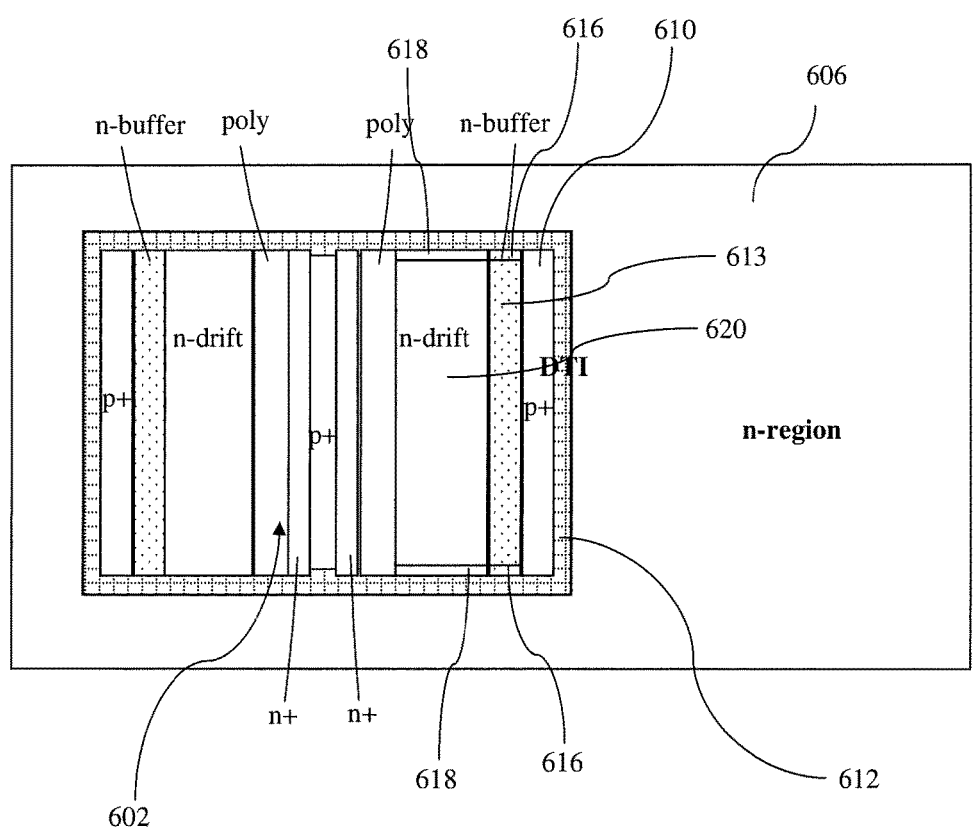
FIG. 7 is a schematic diagram of a plan view of an n-type LIGBT on an SOI wafer comprising PSOI technology.

FIG. 6 shows a conventional half of an LIGBT device employing PSOI technology and FIG. 7 shows a conventional top view of the complete structure of FIG. 6.

The LIGBT device 600 comprises a device structure 602 that is insulated from a handle wafer 604 and lateral semiconductor region 606 as discussed above. The lateral semiconductor region 606 is n-doped and the handle wafer 604 is p-doped and the two form a p-n junction, which is referred to as a buried diode. A lateral semiconductor region terminal 608 is in electrical communication with the lateral semiconductor region 606.

Typically, in an off state, the voltages applied to the device 600 are the same as those applied to the device 500 of FIG. 5. In addition, a high voltage, for example around 100 Volts or greater is applied to the lateral semiconductor region terminal 608, thereby biasing the lateral semiconductor region 606. The handle wafer 604 is typically held at ground. There will be some potential drop across the p-n junction of the buried diode, but the handle wafer will still be at a voltage much higher than ground in the region close to the BOX insulator layer 614.

When a high voltage is applied to both the p-doped anode region 610 and to the lateral semiconductor region terminal 608, there is no significant potential difference across the DTI insulator trench 612 between the n-doped n-buffer region 613 and the lateral semiconductor region 606, or across the BOX insulator layer 614 between the n-doped n-buffer region 613 and the handle wafer 604. However, during a test typically undertaken to determine the breakdown voltage of the device 600, a low voltage, for example zero volts or less, is applied to the p-doped anode region 610 at the beginning of the test and the voltage is increased over time until breakdown is achieved. Typically, breakdown may occur at voltages of 200 Volts or greater.

Therefore, in the early stages of the test, a significant potential difference exists across the DTI insulator trench 612 and the BOX insulator layer 614. During this time, a coupling effect across the DTI insulator trench 612 and the BOX insulator layer 614 and the n-doped n-buffer region 613 may cause a region 616 close to the boundaries with the DTI insulator trench and the BOX insulator layer to be inverted. In addition, a region 618 of an n-doped n-drift region 620 close to the boundary with the BOX insulator layer 614 may also be inverted.

Dependent on the doping concentration in lateral semiconductor region 606, the potential line distribution will vary along the lateral semiconductor region 606 towards the handle wafer 604. However, the voltage in the lateral semiconductor region 606 is significantly higher than ground.

As the voltage applied to the anode region 610 is swept from ground up to voltages in excess of 200 Volts, the n-drift region 620 and the n-buffer region 613 will be inverted at the regions 618 and 616 respectively as long as a sufficient potential difference is seen between the n-drift region 620 and handle wafer 604, between the n-buffer region 613 and the handle wafer 604, and between the n-buffer region and the lateral semiconductor region 606. A leakage current path is therefore created for holes to flow from anode region 610, through the inverted regions 616, 618 to a highly p-doped pick up 622 in a p-well 624.

FIG. 7 shows a plan view of the complete device of FIG. 6. The same reference signs have therefore been used to show corresponding features. FIG. 7 shows that the inverted regions 616, 618 may also exist in the third dimension, i.e. they may cover the surface of the n-buffer 613 and n-drift 620 regions that form a boundary with the DTI insulator trench 612 or the BOX layer 614. This is because the active region of the device is surrounded by the DTI insulator trench 612 and the BOX layer 614.

Figure 8:
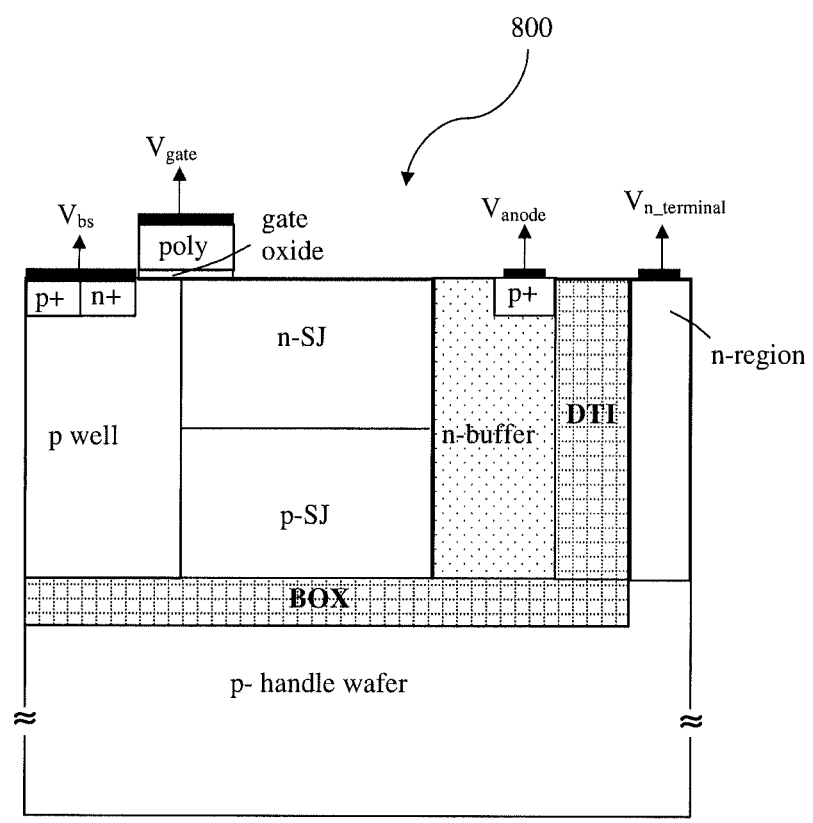
FIG. 8 is a schematic diagram of a partial cross section through an n-type super junction LIGBT on an SOI wafer comprising partial SOI technology.

FIG. 8 shows a conventional device 800 in which the n-drift region of FIG. 7 is replaced by a vertical super junction, in which an n-buffer is sandwiched between a DTI insulator trench and the vertical super junction, with its p-doped region. In such an arrangement, a leakage current path may exist in both low-side and high-side applications, as the buried diode is always reverse biased. This means that there is distribution of potential along region 606 close to the DTI 612 and the handle wafer region 604 close to BOX layer 614. Thus, a potential difference exists between the device region 602 (internal silicon) and the buried diode, which comprises the lateral semiconductor region 606 and the handle wafer 604. Therefore, such devices are always susceptible to a full leakage path.

The mechanism discussed above by which a leakage current path may exist in SOI and PSOI devices may also be applicable to other devices, such as a p-type LDMOS, a thyristor, a p-type LIGBT and a p-n-p bipolar transistor. The earlier leakage current path can be found if a coupling effect causes inversion of a region of a device structure and the structures themselves provide a complete current path to allow the collection of holes or electrons.

An LIGBT using SOI or PSOI technology may have a shallow n-doped buffer that surrounds a highly p-doped anode. The p-doped anode may be isolated from the DTI by either using n-buffer, or by using shallow trench isolation (STI) or local oxidation of silicon (LOCOS) techniques. It is possible that such methods may avoid the complete leakage current path referred to above, even when the n-drift and n-buffer regions close to the boundaries with the BOX insulator layer and DTI insulator trench are inverted. However, those methods add extra lateral dimension to the device increasing its size.

It is possible that an n-type SOI LIGBT device implementing a source-emitter-source arrangement would not be subject to the complete leakage current path described above, as the source is always at a lower voltage and thus the potential difference between the source and an n-region adjacent a DTI insulator trench is too small to invert a highly doped p-well. However, this kind of arrangement would possibly suffer from an earlier breakdown voltage, as the electric field within the device is converging.

In the case of both a low-side and high-side LIGBT being integrated on a PSOI wafer, which has an opening in the BOX insulator layer, the leakage current problem may be different to that described above. In this case, the inversion in an n-drift region at the low-side LIGBT will lead to a leakage current path to the cathode of the high-side LIGBT if the BOX opening is beneath the low-side LIGBT anode. A solution that may be used to avoid this leakage path is either to place a higher doped n-drift region near the BOX insulator layer, or not to have the BOX opening beneath the anode of low-side IGBT.

The inventors have appreciated that the leakage current path problem may be addressed by avoiding the inverted layer in doped regions of a device structure of a high voltage SOI or PSOI device.

Figure 9:
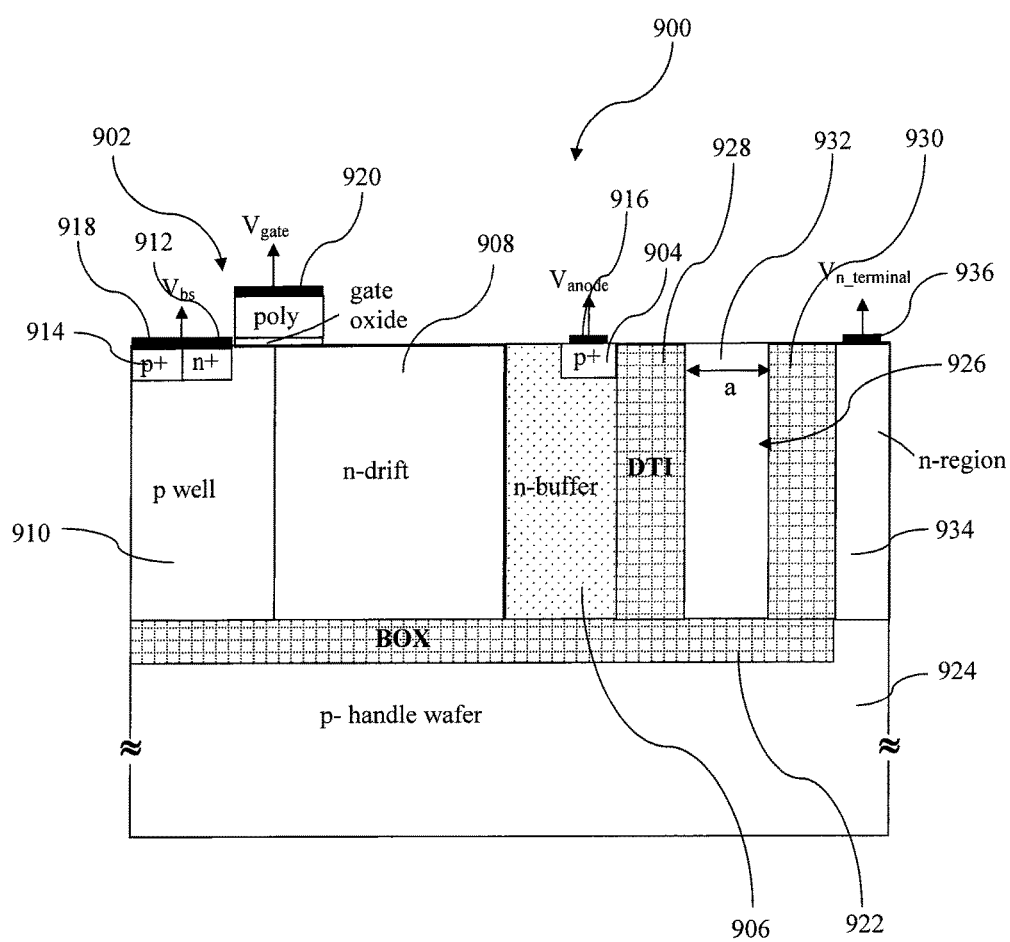
FIG. 9 is a schematic diagram through an n-type LIGBT on SOI wafer comprising partial SOI technology and further comprising a plurality of DTI.

Referring to FIG. 9, a section through half of a high voltage LIGBT employing PSOI technology is shown. Generally, the LIGBT has multiple DTI insulator trenches, which reduces the coupling effect between a lateral semiconductor region and regions within the device structure. In the exemplary LIGBT of FIG. 9, two DTI insulator trenches are used.

LIGBT 900 comprises a device structure 902 comprising a number of doped semiconductor regions. Specifically, the device structure 902 comprises a highly p-doped anode region 904, and n-doped n-buffer region 906, an n-doped n-drift region 908, a p-doped p-well 910 and highly n-doped and highly p-doped pick-up regions 912, 914.

Electrical terminals are in electrical communication with one or more of the doped semiconductor regions of the device structure 902. Specifically, an anode terminal 916 is in electrical communication with the anode region 904, a source terminal 918 is in electrical communication with the p-doped and n-doped pick-up regions 912, 914 and a gate terminal 920 is in electrical communication with the n-drift region 908 and the p-well region 910. It is noted that the term "electrical communication" as used herein encompasses both a physical connection, as in the case of the anode and source terminals 916, 918, and a field effect connection in which an electric field may influence the doped semiconductor regions, as in the case of the gate terminal 920.

The doped semiconductor regions are configured to operate as an LIGBT on application of the appropriate voltages to the terminals, as will be appreciated by the skilled person.

A BOX insulator layer 922 is located between a bottom surface of the device structure 902 and a handle wafer 924 and is configured to insulate the device structure 902 from the handle wafer 924. A DTI insulator trench structure 926 comprises an inner DTI trench 928 and an outer DTI trench 930 separated by a semiconductor island 932. A dimension "a" denotes the width of the semiconductor island 932. The DTI insulator trench structure is configured to insulate the device structure 902 from a lateral semiconductor region 934 located laterally with respect to the device structure 902.

In the exemplary device 900 of FIG. 9, PSOI technology is employed. The lateral semiconductor region 934 is n-doped and the handle wafer 924 is p-doped and a p-n junction therefore exists between the lateral semiconductor region 934 and the handle wafer 924 to form a buried diode. A lateral semiconductor region terminal 936 is in electrical communication with the lateral semiconductor region 934.

When the device 900 is in an off-state, and during a test to determine the breakdown voltage of the device 900, a high voltage, for example 100 Volts or greater, may be applied to the lateral semiconductor region terminal 936. In specific examples, the voltage applied to the lateral semiconductor region terminal 936 may be 200 Volts. A low voltage, relative to the voltage at the lateral semiconductor region terminal 936, is applied to the source terminal 918.

The voltage applied to the source terminal 918 may be, for example, zero Volts or less. Typically, the source terminal 918 may be held at ground. A low voltage, relative to the voltage applied to the lateral semiconductor region terminal 936, is also applied to the gate terminal 920. A difference in the voltage applied to lateral semiconductor region terminal 936 and the source or gate terminals may be in the range from 10 Volts to 250 Volts, more specifically, in the range from 50 Volts to 250 Volts and more specifically still, in the range from 100 Volts to 200 Volts.

During the test, a voltage applied to the anode terminal 916 is increased over time from a low voltage, relative to the voltage applied to the lateral semiconductor region terminal 936, to a high voltage, for example 100 Volts or greater, more specifically, 200 Volts or greater.

The high voltage applied to the lateral semiconductor region terminal 936 biases the lateral semiconductor region 934 to a similarly high voltage. The voltage at different positions within the lateral semiconductor region 934 will vary as a function of distance from the terminal 936. However, normally, the voltage in the lateral semiconductor region will, at all positions, be high as defined herein. The base of the handle wafer 924 is held at ground. In addition, there will be some voltage drop across the buried diode p-n junction. However, in the region of the handle wafer 924 close to the BOX insulator layer 922 a high voltage as defined herein will be seen.

In the early stages of the test, the relatively low voltage applied to the anode terminal 916 and the source terminal 918 biases the device structure 902 to a similarly low voltage. Therefore, a potential difference exists between the lateral semiconductor region 934 and the n-buffer region 906. In addition, a potential difference exists between the handle wafer 924 and the n-buffer region 906 and between the handle wafer 924 and the n-drift region 908.

As explained in detail above, the potential difference between the handle wafer 924 and the n-buffer region 906 and the n-drift region 908 may cause a region of the n-buffer region 906 and the n-drift region 908 close to the boundary with the BOX insulator layer to become inverted.

However, the insulator trench structure 926 is configured to prevent the formation of an inversion layer in the n-buffer region 906 when the potential difference between the lateral semiconductor region 934 and the n-buffer region 906 is high, e.g. 100 Volts or greater.

In the exemplary device 900 of FIG. 9, the insulator trench structure comprises two trenches. The DTI trenches comprise silicon oxide across which large amounts of potential may be dropped. Therefore, by increasing the number of silicon oxide trenches, the amount of potential dropped across the silicon oxides may also be increased. Therefore, in the arrangement of FIG. 9, there will be a drop in potential across the outer DTI trench 930, placing the semiconductor island 932 at a lower potential than the lateral semiconductor region 934. The potential difference between the semiconductor island 932 and the n-buffer region 906 is therefore reduced and this, in turn, reduces the likelihood of inversion of a region of the n-buffer region 906 close to the boundary with the inner DTI trench 928. Put another way, the potential difference between the lateral semiconductor region 934 and the n-buffer region may be larger than in known devices (with a single, standard DTI insulator trench) before inversion of the n-buffer region 906 occurs. There is additionally some drop in potential across the semiconductor island due to silicon resistance.

Design rules are a series of specifications enabling a device designer to design a device complying with certain specific geometric and connectivity restrictions to ensure sufficient margins to account for variability in semiconductor manufacturing processes. This helps to ensure correct operation of the device. Design rules may, for example, include a width design rule that specifies the minimum width of any shape in the design and a spacing rule that specifies the minimum distance between two adjacent objects.

In the exemplary device 900, the width of the semiconductor island 932, denoted by value "a", is determined by a 0.5 μm design rule. Specifically, the width of the semiconductor island is 0.5 μm. Typically, the use of design rules in device design requires design and manufacturing equipment is set such that the various rules are always adhered to. As part of this process, and considering mass manufacturing runs, deviation from the specified design rules within the manufacturing process may be costly. The width of the semiconductor island 932 may therefore be a multiple of the minimum width specified by the design rule. The maximum width of the semiconductor island can be any value, but may not have a large impact on the leakage current path in the device as a larger amount of potential is dropped across the silicon oxide of the DTI trenches 928, 930.

If more DTI trenches are introduced to the device 900, the possibility for inversion in the n-buffer region 906 close to the boundary with the inner DTI trench 928 is reduced as most of the voltage will have been dropped across the outer DTI trenches.

As the region of the n-buffer region 906 close to the boundary with the inner DTI insulator trench 928 is not inverted, a complete leakage current path from the anode 904 to the p-doped pick-up 914 does not exist.

In other exemplary LIGBTs, a single DTI trench may be used wherein the width of the trench is arranged to prevent or substantially reduce inversion of the region of the n-buffer region close to the boundary with the DTI trench when a potential difference in the range from 100 Volts to 200 Volts exists between the lateral semiconductor region and the n-buffer region. The width of the DTI trench may therefore be increased to achieve this.

Figure 10:
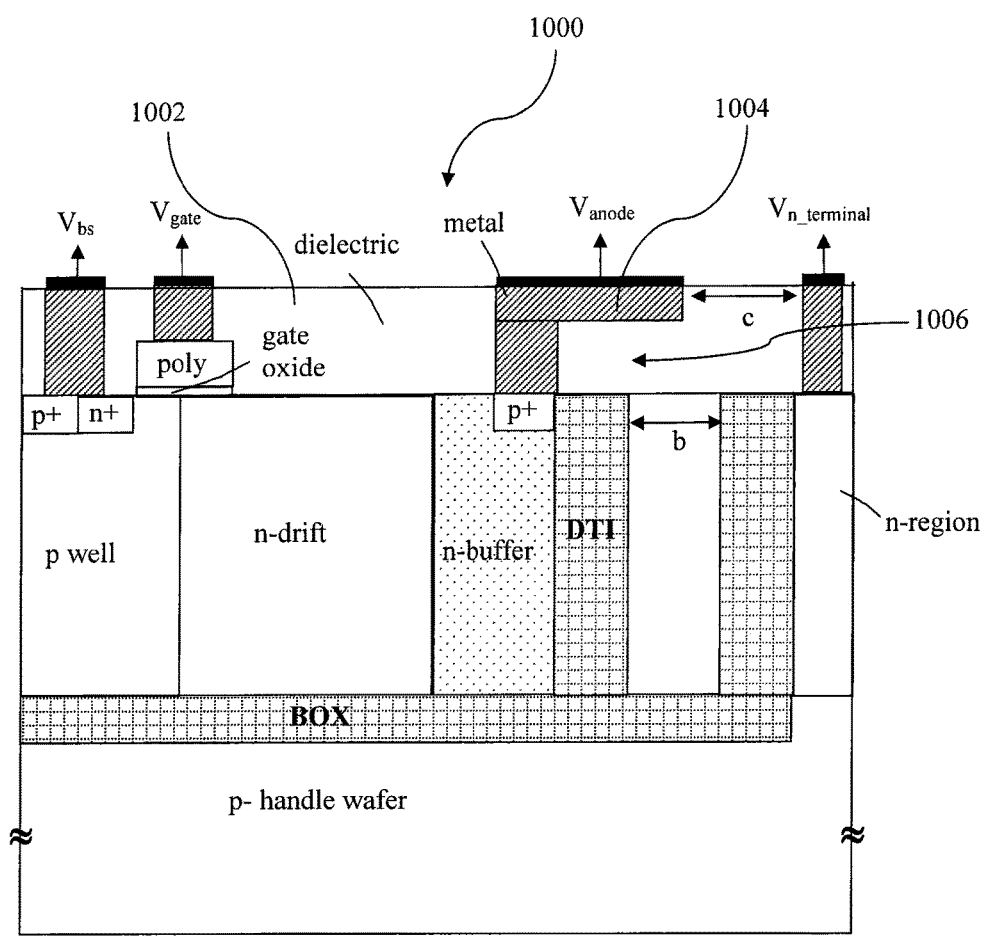
FIG. 10 is a schematic diagram through an n-type LIGBT on SOI wafer comprising partial SOI technology and further comprising a plurality of DTI and a field plate terminal.

Referring to FIG. 10, any features of the device that are described and correspond to those in FIG. 9 are referenced by the same numerals. The device 1000 includes a dielectric layer 1002 positioned on an upper surface of the device 1000. Metal layers connect the electrical terminals 912, 916, 918, 936 through the dielectric layer 1002 to the relevant regions of the device 1000. In addition, a field plate 1004 is connected to the metal layer of the anode region 904 and extends across the dielectric layer 1002 such that at least part of the field plate 1004 is located above the semiconductor island 932. The anode electrical terminal 916 covers and is electrically connected to the field plate 1004. The field plate 1004 is embedded within the dielectric layer 1002 and a region 1006 of the dielectric layer 1002 separates the field plate 1004 from the semiconductor island 932.

A further coupling effect is introduced between the field plate 1004 and the semiconductor island 932. This reduces the potential seen at the semiconductor island 932 and, therefore, reduces the potential difference between the semiconductor island 932 and the n-buffer region 906. As a result, the region of the n-buffer region 906 close to the boundary with the inner DTI insulator trench 928 is less likely to become inverted.

In use, the voltage applied to the anode electrical terminal 916 biases the anode region 904 and the n-buffer region 906 to a similar voltage. In addition, the field plate 1004 introduces a coupling effect between the field plate 1004 and the semiconductor island 932 that works to bias the semiconductor island 932 to the same or similar voltage as that applied to the anode electrical terminal 916 and, as explained above, to the anode region 904 and the n-buffer region 906. The field plate 1004 therefore works to reduce further the potential difference between the semiconductor island 932 and the n-buffer region 906 reducing the likelihood of inversion in the n-buffer region 906. The use of the field plate 1004 allows the use of fewer DTI insulator trenches. In fact, use of the field plate 1004 means that a device having two DTI insulator trenches in the trench structure is able to eliminate the chance of inversion of the n-buffer region 906 for all practical potential differences between the lateral semiconductor region 934 and the n-buffer region 906.

The value "b" shown in FIG. 10 represents the width of the semiconductor island 932 between the inner DTI insulator trench 928 and the outer DTI insulator trench 930. The width of the semiconductor island may be in the range from the minimum width of the design rule, for example 5 μm, up to any practical value. The value "c" in FIG. 10 represents the width of the dielectric material of the dielectric layer 1002 between the metal layers of the field plate 1004 and the lateral semiconductor terminal metal layer, which is configured to connect the lateral semiconductor terminal 936 to the lateral semiconductor region 932. The minimum value of c must be enough to avoid dielectric breakdown between the two metal layers when a high potential difference, for example in the range from 100 Volts to 200 Volts, is applied between the lateral semiconductor region terminal 936 and the anode terminal 916. The value "c" may, for example, be in the range from 0.2 μm to 0.25 μm and, more specifically, may be 0.23 μm. The value "c" may be determined as part of a 0.18 μm technology design rule. For example, in 0.18 um technology, c is designed to be 0.23 μm.

Figure 11:
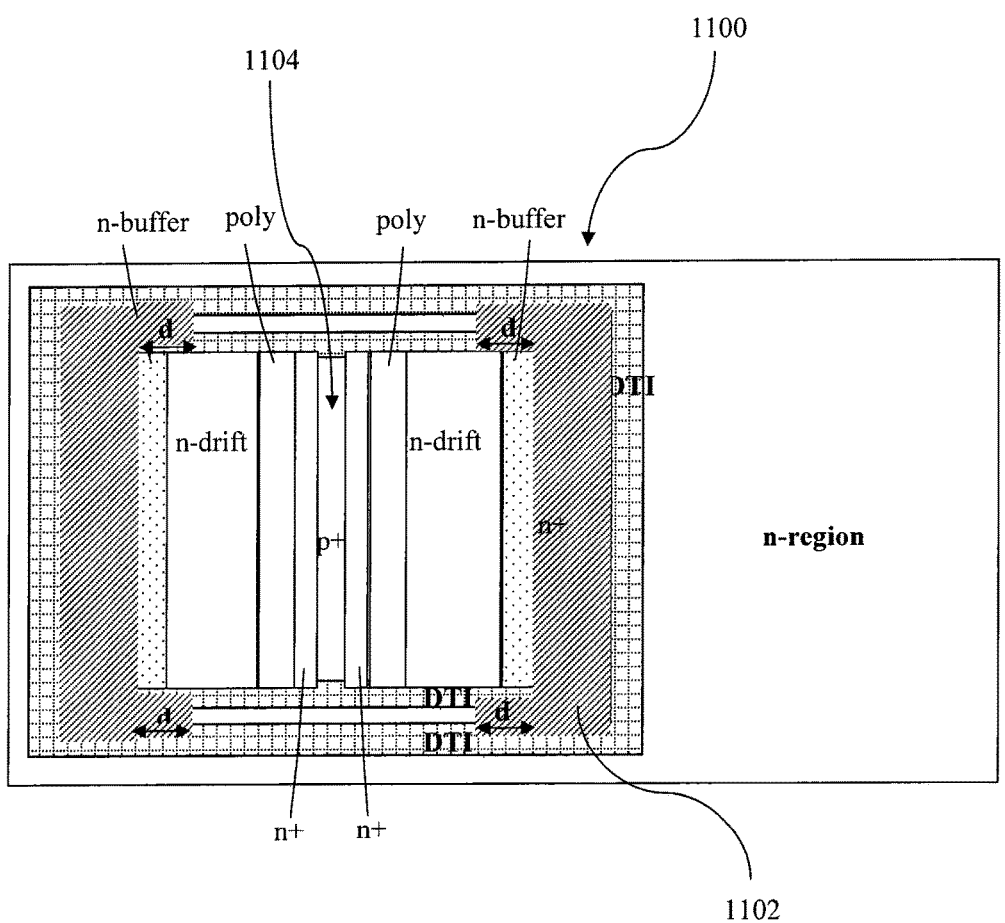
FIG. 11 is a schematic diagram showing a plan view of an n-type LIGBT wherein the field plate extends toward a central region of the device.

Referring to FIG. 11, a plan view of a device 1100 is shown. The features of the device 1100 that are described and correspond to those in FIGS. 9 and 10 are referenced by the same numerals. As shown in FIG. 11, the field plate 1102 may extend around the sides of the device structure 902 toward a central region 1104 of the device structure 902. The inventors have appreciated that the leakage current path may be evident at all boundaries between the n-buffer region 906 and the inner DTI insulator trench 928. It may therefore be advantageous to extend the field plate 1102 by a value "d" toward the central region 1104 of the device structure 902 to cover the semiconductor island 932 adjacent the sides of the n-buffer region 906. As can be seen from FIG. 11, the field plate 1102 extends just beyond the boundary between the n-buffer region 906 and the n-drift region 908. However, in the device 1100, the field plate 1102 should extend at least as far as that boundary. The value "d" should not extend so far as to affect significantly the breakdown voltage of the device 1100.

As the field plate 1102 extends to cover the semiconductor island 932 adjacent the side of the n-buffer region 906, it also has a coupling effect on that portion of the semiconductor island 932 and, therefore, works to bias those portions of the semiconductor island 932 to substantially the same voltage as the n-buffer region 906. In this way, the device 1100 is configured to reduce the potential difference between the semiconductor island 932 and the n-buffer region 906 on all sides. This configuration is able to cut off the leakage current path in the device 1100 in all directions.

The devices 900, 1000, 1100 are all LIGBT devices. However, the methods and apparatuses disclosed herein may be used in any high voltage SOI or PSOI device in which the leakage current path exists. For example, the methods and apparatuses disclosed herein may be used in conjunction with the exemplary device of FIG. 2.

It will be understood that the devices disclosed herein have particular regions that are n-doped and other regions that are p-doped, but these dopings may be reversed in some devices to produce the similar devices.

Typically, the semiconductor materials described above are silicon. However, other semiconductor materials, such as Germanium or Gallium Arsenide, may also be used.

Devices 900, 1000, 1100 proposed herein may be manufactured in such a way not to add additional process steps. Further, manufacture of the devices does not require additional masks. In view of this, manufacture of the devices does not add complexity to the process flow. The devices disclosed herein allow the combination of lateral IGBT (either RESURF or Super Junction) with partial SOI and DTI techniques to be integrated with CMOS devices on an SOI process flow, allowing an integrated IGBT also enjoying the advantages brought by PSOI, which gives lower switching loss and higher breakdown voltage.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A partial silicon on insulator (PSOI) LIGBT device, comprising:
    a device structure to provide functionality of an LIGBT, said device structure comprising:
    a plurality of doped semiconductor regions in uninterrupted electrical connection to one or more electrical terminals, wherein at least one of the one or more electrical terminals is an anode or a collector;
    an insulator layer located between a bottom surface of the plurality of doped semiconductor regions and a handle wafer;
    a lateral semiconductor region located laterally with respect to the plurality of doped semiconductor regions;
    a plurality of insulator trenches, each as part of the PSOI device and located between a side surface of the plurality of doped semiconductor regions and the lateral semiconductor region; and
    a dielectric layer on an upper surface of the device,
    wherein:
    the insulator layer and the plurality of insulator trenches are configured to insulate the plurality of doped semiconductor regions from the handle wafer and the lateral semiconductor region;
    the plurality of insulator trenches comprises an inner insulator trench and an outer insulator trench separated by a semiconductor island;
    the anode or collector is in uninterrupted electrical connection to a doped semiconductor region directly contacting the inner insulator trench and is directly electrically connected to a field plate extending over at least part of the dielectric layer and at least part of the semiconductor island, wherein the doped semiconductor region directly contacting the inner insulator trench is an N-buffer; and the handle wafer and the lateral semiconductor region are oppositely doped to form a buried diode structure.

2. A device according to claim 1, wherein the plurality of insulator trenches is configured to prevent the formation of an inversion layer in an outer doped semiconductor region of the plurality of doped semiconductor regions at the boundary between the outer doped semiconductor region and an innermost insulator trench when a potential difference exists between the lateral semiconductor region and the outer doped semiconductor region.

3. A device according to claim 2, wherein the potential difference is in the range from 100 Volts to 200 Volts.

4. A device according to claim 1, wherein the width of the semiconductor island is equal to or greater than a minimum width specified by a design rule.

5. A device according to claim 1, wherein the width of the semiconductor island is a multiple of a width specified by a design rule.

6. A device according to claim 1, wherein the width of the semiconductor island is 0.5 µm or greater.

7. A device according to claim 1, wherein the field plate is configured to bias the semiconductor island and the doped semiconductor region to the same voltage when a voltage is applied to the field plate.

8. A device according to claim 1, further comprising a lateral semiconductor region terminal in electrical communication with the lateral semiconductor region, and wherein a distance between the lateral semiconductor region terminal and the field plate is sufficient to prevent breakdown of the dielectric layer between the lateral semiconductor region terminal and the field plate when a voltage difference of 100 Volts or greater is applied between the lateral semiconductor region terminal and the field plate.

9. A device according to claim 8, wherein the distance between the lateral semiconductor region terminal and the field plate is 0.23 µm.

10. A device according to claim 1, wherein the plurality of insulator trenches extend around at least one further side of the plurality of doped semiconductor regions, and wherein at least part of the field plate extends along the at least one further side of the plurality of doped semiconductor regions over at least part of the semiconductor island.

11. A device according to claim 10, wherein the at least part of the field plate extends to cover all of the semiconductor island opposite an outer doped semiconductor region.

12. A device according to claim 1, wherein the insulator layer comprises an aperture through which the lateral semiconductor region and the handle wafer are connected.

13. A device according to claim 1, wherein the plurality of insulator trenches surround the plurality of doped semiconductor regions on all sides.

14. A device according to claim 1, wherein the insulator layer comprises buried silicon oxide.

15. A device according to claim 1, wherein the insulator trenches each comprise a trench filled with a silicon oxide.

16. A device according to claim 1, wherein the device is a high voltage device.

17. A semiconductor wafer comprising a plurality of devices according to claim 1.

18. A device according to claim 1, wherein the field plate extends over at least part of the dielectric layer and at least part of the semiconductor island such that the field plate overlaps with at least part of the dielectric layer and at least part of the semiconductor island.

19. A device according to claim 1, wherein the field plate extends over at least part of the dielectric layer and at least part of the semiconductor island such that a first straight line which is perpendicular to the upper surface of the device passes through the field plate and the dielectric layer, and a second straight line which is perpendicular to the upper surface of the device passes through the field plate and the semiconductor island.

20. A device according to claim 1, wherein the field plate is positioned directly above or directly over at least part of the dielectric layer and directly above or directly over at least part of the semiconductor island.

21. A device according to claim 1, wherein the buried diode structure increases the breakdown voltage of the device by preventing electric field crowding in said insulator layer.

22. A partial silicon on insulator (PSOI) LIGBT device, comprising:
   a device structure to provide functionality of an LIGBT, said device structure comprising;
   a plurality of doped semiconductor regions arranged to be in uninterrupted electrical connection to one or more electrical terminals, wherein at least one of the one or more electrical terminals is an anode or a collector;
   an insulator layer located between a bottom surface of the plurality of doped semiconductor regions and a handle wafer;
   a lateral semiconductor region located laterally with respect to the plurality of doped semiconductor regions;
   a plurality of insulator trenches, each part of the PSOI device and located between a side surface of the plurality of doped semiconductor regions and the lateral semiconductor region; and
   a dielectric layer on an upper surface of the device, wherein the insulator layer and plurality of insulator trenches are configured to insulate the plurality of doped semiconductor regions from the handle wafer and the lateral semiconductor region;
   wherein:
   the total width of the plurality of insulator trenches is configured to prevent the formation of an inversion layer in the plurality of doped semiconductor regions at the boundary between the plurality of doped semiconductor regions and the plurality of insulator trenches when a voltage difference of 100 Volts or greater is applied between the lateral semiconductor region and the plurality of doped semiconductor regions;
   the plurality of insulator trenches comprises an inner insulator trench and an outer insulator trench separated by a semiconductor island;
   the anode or collector is in uninterrupted electrical connection to a doped semiconductor region directly contacting the inner insulator trench and is directly electrically connected to a field plate extending over at least part of the dielectric layer and at least part of the semiconductor island, wherein the doped semiconductor region directly contacting the inner insulator trench is an N-buffer; and
   the handle wafer and the lateral semiconductor region are oppositely doped to form a buried diode structure.

23. A partial silicon on insulator (PSOI) LIGBT device comprising:
   a device structure to provide functionality of an LIGBT, said device structure comprising;
   a handle wafer and a plurality of doped semiconductor regions in uninterrupted electrical connection to one or more electrical terminals, wherein at least one of the one or more electrical terminals is an anode or a collector;

a lateral semiconductor region located laterally with respect to the plurality of doped semiconductor regions;

a first insulator trench and a second insulator trench, each as part of the PSOI device and located between a side surface of the plurality of doped semiconductor regions and the lateral semiconductor region; and a dielectric layer on an upper surface of the device, wherein the first insulator trench is located between the side surface of the plurality of doped semiconductor regions and the second insulator trench;

wherein:

the first insulator trench and the second insulator trench are separated by a semiconductor island; and the anode or collector is in uninterrupted electrical connection to a doped semiconductor region directly contacting the first insulator trench and is directly electrically connected to a field plate extending over at least part of the dielectric layer and at least part of the semiconductor island, wherein the doped semiconductor region directly contacting the first insulator trench is an N-buffer; and wherein the handle wafer and the lateral semiconductor region are oppositely doped to form a buried diode structure.

24. A partial silicon on insulator (PSOI) LIGBT device, comprising:

a device structure to provide functionality of an LIGBT, said device structure comprising;

a plurality of doped semiconductor regions in uninterrupted electrical connection to one or more electrical terminals;

an insulator layer located between a bottom surface of the plurality of doped semiconductor regions and a handle wafer;

a lateral semiconductor region located laterally with respect to the plurality of doped semiconductor regions;

a plurality of insulator trenches, each as part of the PSOI device and located between a side surface of the plurality of doped semiconductor regions and the lateral semiconductor region; and a dielectric layer on an upper surface of the device, wherein:

the insulator layer and the plurality of insulator trenches are configured to insulate the plurality of doped semiconductor regions from the handle wafer and the lateral semiconductor region;

the plurality of insulator trenches comprises an inner insulator trench and an outer insulator trench separated by a semiconductor island, wherein the semiconductor island is completely insulated; and at least one of the one or more electrical terminals is in uninterrupted electrical connection to a doped semiconductor region directly contacting the inner insulator trench and is directly electrically connected to a field plate extending over at least part of the dielectric layer and at least part of the semiconductor island, wherein the doped semiconductor region directly contacting the first insulator trench is an N-buffer; and wherein the handle wafer and the lateral semiconductor region are oppositely doped to form a buried diode structure.

* * * * *